United States Patent
Kubota et al.

(10) Patent No.: US 6,461,437 B1
(45) Date of Patent: Oct. 8, 2002

(54) APPARATUS USED FOR FABRICATING LIQUID CRYSTAL DEVICE AND METHOD OF FABRICATING THE SAME

(75) Inventors: Takeshi Kubota, Hyogo (JP); Norikazu Komatsu, Nagano (JP)

(73) Assignees: Mitsubishi Denki Kabushiki Kaisha; Seiko Epson Corporation, both of Tokyo (JP)

( * ) Notice: Subject to any disclaimer, the term of this patent is extended or adjusted under 35 U.S.C. 154(b) by 0 days.

(21) Appl. No.: 09/715,022

(22) Filed: Nov. 20, 2000

(30) Foreign Application Priority Data

Jan. 26, 2000 (JP) .......................... 2000-17223

(51) Int. Cl.[7] .............................. C23C 16/00; C23F 1/00
(52) U.S. Cl. .................. 118/719; 118/715; 156/345.11; 156/345.22; 156/345.31; 156/345.32; 156/345.5; 156/345.55; 156/345.21; 414/217.1; 414/935; 414/937; 414/939; 414/940
(58) Field of Search .............................. 156/345, 345.1, 156/345.11, 345.12, 345.13, 345.14, 345.15, 345.16, 345.17, 345.18, 345.19, 345.2, 345.21, 345.22, 345.23, 345.54, 345.55, 345.31, 345.32, 345.5; 118/715, 719, 718; 414/935, 217.1, 936, 937, 939, 940; 134/1.3

(56) References Cited

U.S. PATENT DOCUMENTS

| | | | |
|---|---|---|---|
| 4,406,709 A | * | 9/1983 | Celler et al. ................. 148/1.5 |
| 4,495,024 A | * | 1/1985 | Bok ........................... 156/646 |
| 4,649,830 A | * | 3/1987 | Tanaka ..................... 104/138.1 |
| 4,770,680 A | * | 9/1988 | Machida et al. ............ 55/385.1 |
| 4,827,954 A | * | 5/1989 | Layton ......................... 134/76 |
| 4,951,601 A | * | 8/1990 | Maydan et al. ............. 118/719 |
| 5,024,570 A | * | 6/1991 | Kiriseko et al. ............ 414/222 |
| 5,388,944 A | * | 2/1995 | Takanabe et al. ........... 414/217 |
| 5,474,410 A | * | 12/1995 | Ozawa et al. ............... 414/217 |
| 5,512,320 A | * | 4/1996 | Turner et al. ............... 427/255 |
| 5,527,390 A | * | 6/1996 | Ono et al. .................. 118/719 |
| 5,529,630 A | * | 6/1996 | Imahashi et al. ........... 118/665 |
| 5,536,320 A | * | 7/1996 | Ushikawa et al. .......... 118/719 |
| 5,551,984 A | * | 9/1996 | Tanahashi ................... 118/724 |
| 5,609,689 A | * | 3/1997 | Kato et al. .................. 118/719 |
| 5,665,200 A | * | 9/1997 | Fujimoto et al. ........... 438/694 |
| 5,667,592 A | * | 9/1997 | Boitnott et al. ............. 118/719 |
| 5,755,332 A | * | 5/1998 | Holliday et al. ............ 206/711 |
| 5,820,679 A | * | 10/1998 | Yokoyama et al. ......... 118/719 |
| 5,958,145 A | * | 9/1999 | Yonemizu et al. ............. 134/2 |
| 6,045,620 A | * | 4/2000 | Tepman et al. .............. 118/733 |
| 6,224,679 B1 | * | 5/2001 | Sasaki et al. ................ 118/719 |
| 6,248,180 B1 | * | 6/2001 | Sato et al. ..................... 134/6 |
| 6,270,306 B1 | * | 8/2001 | Otwell et al. .......... 414/222.13 |
| 6,270,582 B1 | * | 8/2001 | Rivkin et al. ............... 118/719 |
| 6,270,619 B1 | * | 8/2001 | Susuki et al. ............... 156/345 |
| 6,295,999 B1 | * | 10/2001 | Bran .......................... 134/1.3 |
| 6,337,174 B1 | * | 1/2002 | Jeon et al. ................... 430/313 |
| 6,343,609 B1 | * | 2/2002 | Kim ........................... 134/1.3 |
| 6,391,117 B2 | * | 5/2002 | Suzuki .......................... 134/1 |

FOREIGN PATENT DOCUMENTS

| | | | |
|---|---|---|---|
| JP | 5-271973 | * | 10/1993 |
| JP | 5-315310 | * | 11/1993 |

OTHER PUBLICATIONS

"LCD Manufacturing Apparatus—Prospects for the Third Period", Ikuhiro UKAI, '97 State–of–the–Art Liquid Crystal Processing Technology, Monthly LCD Intelligence Special Edition, 1997, pp. 21–26.

* cited by examiner

*Primary Examiner*—Jeffrie R. Lund
(74) *Attorney, Agent, or Firm*—Leydig, Voit & Mayer, Ltd.

(57) ABSTRACT

An apparatus for manufacturing a liquid crystal display device that can prevent chemical contamination attributed to contacting an external atmosphere, and a method of manufacturing the liquid crystal display device. The apparatus includes a cleaning chamber, a film deposition chamber for depositing a film on a layer cleaned in the cleaning chamber, and a transporter for transporting a substrate from the cleaning chamber to the film deposition chamber while preventing the substrate from being exposed to the external atmosphere.

14 Claims, 9 Drawing Sheets

APPARATUS USED FOR FABRICATING LIQUID CRYSTAL DEVICE AND METHOD OF FABRICATING THE SAME

BACKGROUND OF THE INVENTION

1. Field of the Invention

The present invention relates generally to apparatuses used for fabricating liquid crystal devices and methods of fabricating the same and particularly to driver circuit integrated liquid crystal display devices and methods of fabricating the same.

2. Description of the Background Art

In a driver circuit integrated liquid crystal display device with a thin film transistor (TFT), a TFT in a pixel region only serves to charge a pixel electrode and switch to hold electric charge. As such, it does not require a precisely controlled threshold voltage, as is required for typical semiconductor devices. As such, it can operate satisfactorily with its thin film semiconductor formed of amorphous silicon.

In recent years, there has been developed a technology using a polycrystalline silicon TFT fabricated by laser-annealing amorphous silicon and there have been increasingly fabricated liquid crystal devices using this polycrystalline silicon TFT. Advantageously, the liquid crystal display device of this type has a driver circuit region and a pixel region integrally formed to reduce its fabrication cost and provide the display pixels with high definition. This polycrystalline silicon TFT is required to have a characteristic required for an element of the driver circuit and it is thus required to have a threshold voltage held with high precision. In this situation, a new issue to be overcome has arisen.

A process using amorphous silicon to fabricate a conventional liquid crystal display device normally includes;prior to the amorphous silicon deposition step, a cleaning step to remove foreign matter and provide an amorphous silicon film with an enhanced contact performance. FIG. 12 shows the environment of a conventional route from a cleaning step to a deposition step. The cleaning step includes a physical cleaning step 110 and a chemical cleaning step 120. A substrate 111 mounted in a cassette 106 is input by an automatic guided vehicle (AGV) 140 into a loader 143 and input by a transport robot 104 into a physical cleaning chamber and thus physically washed. The term "substrate" herein refers to a substrate per se such as a quartz substrate as well as a processed substrate. Initially, the substrate is irradiated with ultraviolet light output from a UV lamp 151 and thus has organic matter removed therefrom. Then the substrate is sent to a physical cleaning unit 152 and therein cleaned with a brush, megasonically, or in a similar manner. Then the substrate is passed through a water-washing unit 154 and a drying unit 155 and thus delivered into an unloader 145. Chemical cleaning step 120, having a chemical cleaning unit 153 using a chemical for cleaning a substrate, has an inlet and an outlet respectively inputting and outputting the substrate in the same manner as the physical cleaning step. The substrate physically and chemically cleaned is accommodated in cassette 106 open to the atmosphere of a clean room and thus transported to a film deposition chamber 102 by the AGV and input to a loader/unloader 146 thereof, in which substrate 111 is ejected by transport robot 104 from cassette 106 and introduced into the film deposition chamber and subjected to the amorphous silicon deposition step. Then, substrate 111 is again exposed to the atmosphere of the clean room and thus transported to a laser annealing chamber and therein it is laser-annealed to crystallize the deposited amorphous silicon. Waiting until the film deposition chamber is available, such substrates can be disadvantageously forced to be reserved in an inventory 130 and an underlying film thereof can be disadvantageously exposed to the atmosphere internal to the clean room over a long period of time. Conventionally, substrates being transported and reserved have been strictly controlled to prevent particles from adhering thereto.

However, the above substrate, exposed to the atmosphere of the clean room, has a surface insufficiently controlled and thus chemically contaminated. Such chemical contamination does not at all affect an amorphous silicon TFT used only in a pixel region. For a polycrystalline silicon TFT configuring a driver circuit, however, the doping effect of metal contamination or the like and the influence of organic contamination, for example upon the grain growth of polycrystalline silicon appear. Thus, the transistor's threshold voltage varies, an in-substrate variance occurs and the driver circuit erroneously operates, disadvantageously resulting in a reduced yield.

SUMMARY OF THE INVENTION

An object of the present invention is to provide an apparatus manufacturing a liquid crystal display device capable of preventing a chemical contamination attributed to being exposed to an atmosphere internal to a clean room, to prevent a threshold voltage from having a variance or the like, and a method of manufacturing the same.

The present invention provides an apparatus manufacturing a liquid crystal display device, including a cleaning chamber cleaning a substrate of a liquid crystal display device, a film deposition chamber depositing a film on the substrate cleaned in the cleaning chamber, and means for transporting the substrate from the cleaning chamber to the film deposition chamber while preventing the substrate from being exposed to an external atmosphere.

As such, the substrate after it is cleaned is not exposed to the atmosphere of the clean room and it is thus prevented from chemical contamination. This can prevent metal contamination resulting in a doping effect and also prevent organic contamination resulting in the crystal grain size having a variance. As such, a threshold voltage does not vary. Furthermore, the substrate after it is cleaned can be free of particles adhering thereto. As a result, the driver circuit does not erroneously operate and the production yield is thus not reduced. It should be noted that the above substrate is that as previously defined.

In the above present apparatus the means for transporting includes a path blocking an external atmosphere and transporting the substrate from the cleaning chamber to the film deposition chamber, and a transporter transporting the substrate through the path.

As such, the substrate can be readily, automatically transported while it is not exposed to the external atmosphere. Since the substrate can be automatically transported, the substrate does not need to wait for a long period of time and it can also be transported in a reduced period of time. Thus, the device can be manufactured efficiently.

In the above present apparatus the means for transporting includes means for inputting into a sealed cassette isolatable from an external atmosphere the substrate cleaned in the cleaning chamber, while preventing the substrate from being exposed to the atmosphere, and means for outputting in the film deposition chamber the substrate from the sealed cassette.

As such, the substrate is not exposed to the external atmosphere and can thus be accommodated in the sealed cassette and thus transported from the cleaning chamber to the film deposition chamber. Thus, the substrate can be free of chemical contamination and particles adhering thereto after it is cleaned. The sealed cassette may be transported from the cleaning chamber's unloading portion to the film deposition chamber's loading portion by means of a transporting machine such as an AGV or manually.

The above present apparatus further includes a cassette load chamber and a transport robot chamber having a transport robot, wherein the cassette load chamber, the cleaning chamber and the film deposition chamber are arranged to surround the transport robot and connected to the transport robot chamber to allow the transport robot to input and output the substrate.

As such, from the cassette load chamber through the cleaning chamber to the film deposition chamber the transport robot can transport the substrate sequentially without exposing the substrate to the external atmosphere. As such, the substrate can be free of chemical contamination and particles adhering thereto after it is cleaned and the film deposition process can be provided rapidly and efficiently. Furthermore, the apparatus having the above each chamber incorporated therein can be miniaturized to save a space in the clean room. In the present apparatus desirably the external-atmosphere blocked path or the sealed cassette has an internal atmosphere depressurized to no more than $10_3$ Pa, for example, an atmosphere of gaseous nitrogen or an atmosphere of dry air. The substrate in the above atmosphere can be free of chemical contamination and particles adhering thereto after it is cleaned and since such atmospheres can be obtained at low cost the production cost is not increased. It should be noted that in the present specification, gaseous nitrogen, dry air and the like will be referred to as an inert gas.

The above present apparatus further includes an annealing chamber connecting to the path and blocked from an external atmosphere, annealing the substrate.

As such, a deposited film can be annealed without being exposed to the external atmosphere. Thus, a deposited amorphous silicon film can be prevent from chemical contamination and the like while it is annealed, and it can thus be provided as a polycrystalline silicon film.

The above present apparatus includes an optical alignment unit capable of laser-annealing the substrate in the annealing chamber.

As such, an amorphous silicon film can be annealed at a low temperature and thus provided as a polycrystalline silicon film having a large crystal grain size. Thus, there can be manufactured a TFT free of chemical contamination and also having a capability allowing the TFT to be used in a driver circuit.

In the above present apparatus the film deposition chamber includes a first film deposition chamber connecting to the path and a second film deposition chamber connecting to the path.

As such, a film deposited in the first deposition chamber that is susceptible to chemical contamination, such as polycrystalline silicon, can be free of chemical contamination on a side thereof opposite to an underlying film as well as on an upper side thereof or a side thereof opposite to the gate insulation film. As such, a stable threshold voltage can be obtained and an increased yield can thus be provided.

In the above present apparatus the path or the cassette is roughly blocked from an external atmosphere to have a loosely sealed structure and it contains a gas inert surrounding the substrate and maintained to have a pressure more positive than the external atmosphere. In this arrangement desirably the apparatus further includes a chemical filter passing and thus introducing the inert gas into the sealed cassette.

The above structure can be implemented less expensively than a tightly sealed structure. As such, chemical contamination and particles adhering to the substrate can be prevented at low cost to further enjoy a further increased yield.

The present invention provides a method of manufacturing a liquid crystal display device, including the steps of, inputting into a cleaning chamber a glass substrate with an underlying film thereon, and cleaning the substrate; outputting the cleaned substrate from the cleaning chamber and inputting the substrate into a film deposition chamber while preventing the substrate from being exposed to an external atmosphere; and depositing an amorphous silicon film on the substrate in the film deposition chamber.

As such, an amorphous silicon film susceptible to chemical contamination can have a lower side free of chemical contamination and particles adhering thereto. As such, the transistor can be free of erroneous operation and a high yield can thus be maintained.

In the above present method the step of depositing is followed by the step of annealing the substrate with the amorphous silicon film deposited thereon while continuing to prevent the substrate from being exposed to the external atmosphere, to provide a polycrystalline silicon film.

As such, in a pixel region a high definition can be achieved and in a driver circuit region the drive transistor can have a high-precision threshold voltage that is inexpensive and stable. Furthermore, the pixel region and the driver circuit region can be integrally formed to allow the liquid crystal display device to be miniaturized, which is important for liquid crystal display devises.

In the above present method the step of depositing is followed by the step of transporting the substrate to another film deposition chamber while continuing to prevent the substrate from being exposed to the external atmosphere and the step of providing a gate insulating film on the polycrystalline silicon film in the another film deposition chamber.

As such, the polycrystalline silicon can have a side opposite to an underlying film and that opposite to the gate insulating film that are free of chemical contamination and particles adhering thereto after the substrate is cleaned. As such, the threshold voltage can be further limited in variation to prevent further yield reduction.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the embodiments of the present invention will be described with reference to the drawings.

First Embodiment

Figure 1:
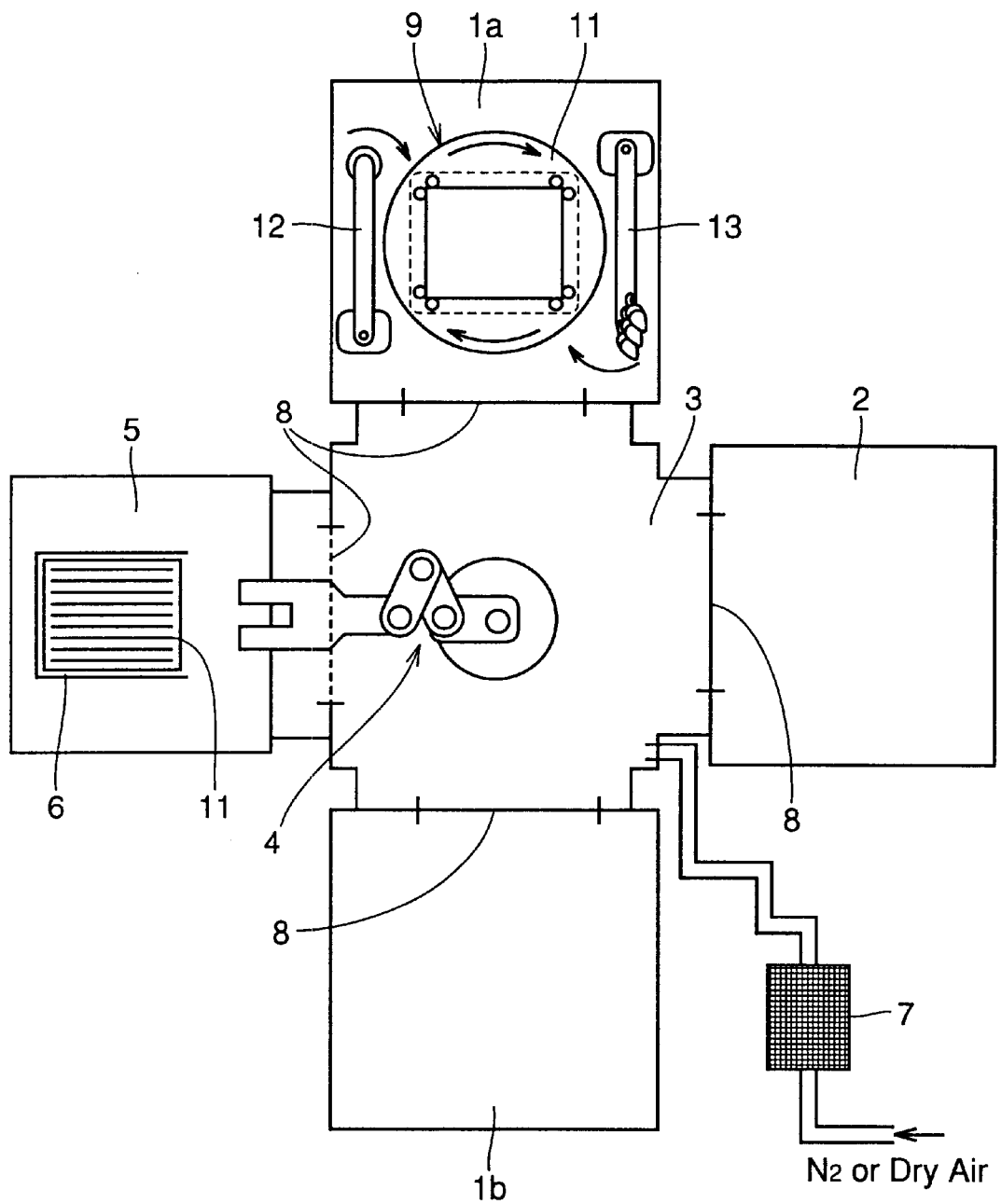
FIG. 1 shows a schematic configuration of an apparatus for manufacturing a liquid crystal display device with cleaning and film deposition processes integrated according to a first embodiment of the present invention.

With reference to FIG. 1, the present apparatus includes a cassette loader 5, a cleaning unit chamber 1a with a spinning, wet cleaning unit (hereinafter referred to as a cleaning unit) 9 installed therein, a UV radiation unit chamber 1b and a CVD apparatus chamber 2. A substrate 11 is moved, one at a time, between the chambers by a transport robot 4 installed in a load lock chamber (a transport robot chamber) 3 arranged at the center of the present apparatus. Load lock chamber 3, UV radiation unit chamber 1b, cleaning unit chamber 1a and CVD apparatus chamber 2 each have a loosely sealed structure, with a piping (not shown) guiding a gas thereinto, introducing gaseous nitrogen or dry air free of any contaminant as it is removed by a chemical filter 7. For each chamber to have an internal pressure more positive than the atmosphere external to the present apparatus, the guided gas has a flow rate controlled to prevent the atmosphere external to the present apparatus from mixing into the atmosphere internal to the present apparatus. Each chamber's entrance, connecting to load lock chamber 3, is provided with a door 8 opened and closed as required to isolate the atmosphere internal to the load lock chamber while a substrate is being processed in the chamber. Between cassette loader 5 and load lock chamber 8 there is also provided door 8 opened and closed as required, closed unless a substrate is transported therethrough. In particular, load lock chamber 3 needs to have a controlled internal atmosphere when a substrate completely cleaned is transported to CVD apparatus chamber 2. The film deposition CVD apparatus chamber is of course adapted to be internally vacuumed or depressurized by a pump, as a normal vacuum apparatus is.

Figure 2:
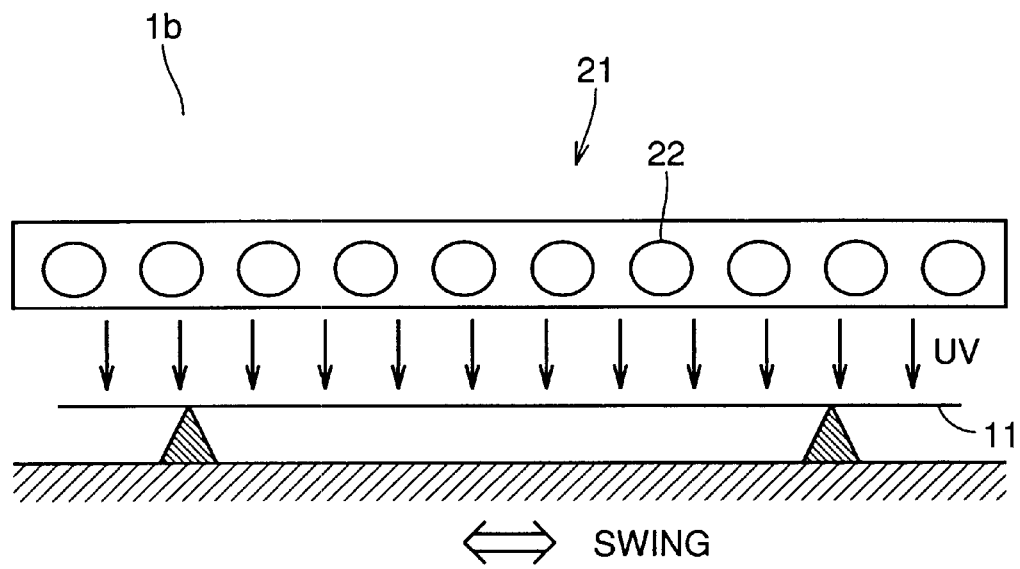
FIG. 2 is a schematic cross section of the FIG. 1 UV (Ultra Violet) radiation unit.
Figure 3:
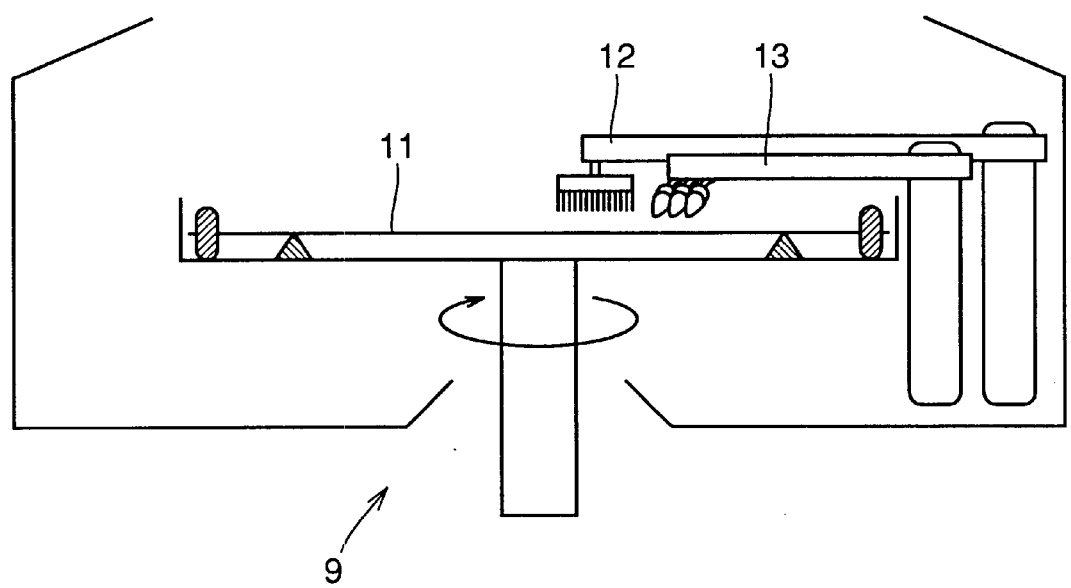
FIG. 3 is a schematic cross section of the FIG. 1 spinning, wet cleaning unit.

A description will now be made of each unit (or device). As shown in FIG. 2, a UV radiation unit 21 matched in size to substrate 11 is provided with low-output UV lamps 22 of approximately 150 W arranged with a density of 0.2 lamp/cm. Furthermore, the stage is movable to swing substrate 11 with an amplitude half the lamp pitch to provide uniform UV radiation. The UV lamp can be replaced for example with an excimer UV lamp having a wavelength of 172 nm to remove an organic matter more efficiently. As shown in FIG. 3, the cleaning device provided herein may have a capability equivalent to that of a cleaning unit, a developing unit and the like of an in-line photolithography apparatus typically used in manufacturing liquid crystal display devices. This cleaning unit 9 includes a substrate rotating mechanism, a brush cleaning mechanism 12 using an arm, and an arm mechanism 13 capable of both of physical cleaning provided for example by a megasonic cleaning mechanism and chemical cleaning employing a nozzle capable of discharging a chemical, a rinsing liquid and the like. The stage supporting a substrate, a cup preventing the chemical from scattering, and the like are desirably resistant to the chemical used to clean the substrate. Herein, to allow a HF type chemical to be used, it is better to use stainless steel coated with teflon. If a combination of the physical cleaning mechanism and a chemical is an inconvenient combination then a spinning, physical cleaning unit may be provided separately. In that arrangement, an oxidizing chemical or the like can also be used.

Figure 4:
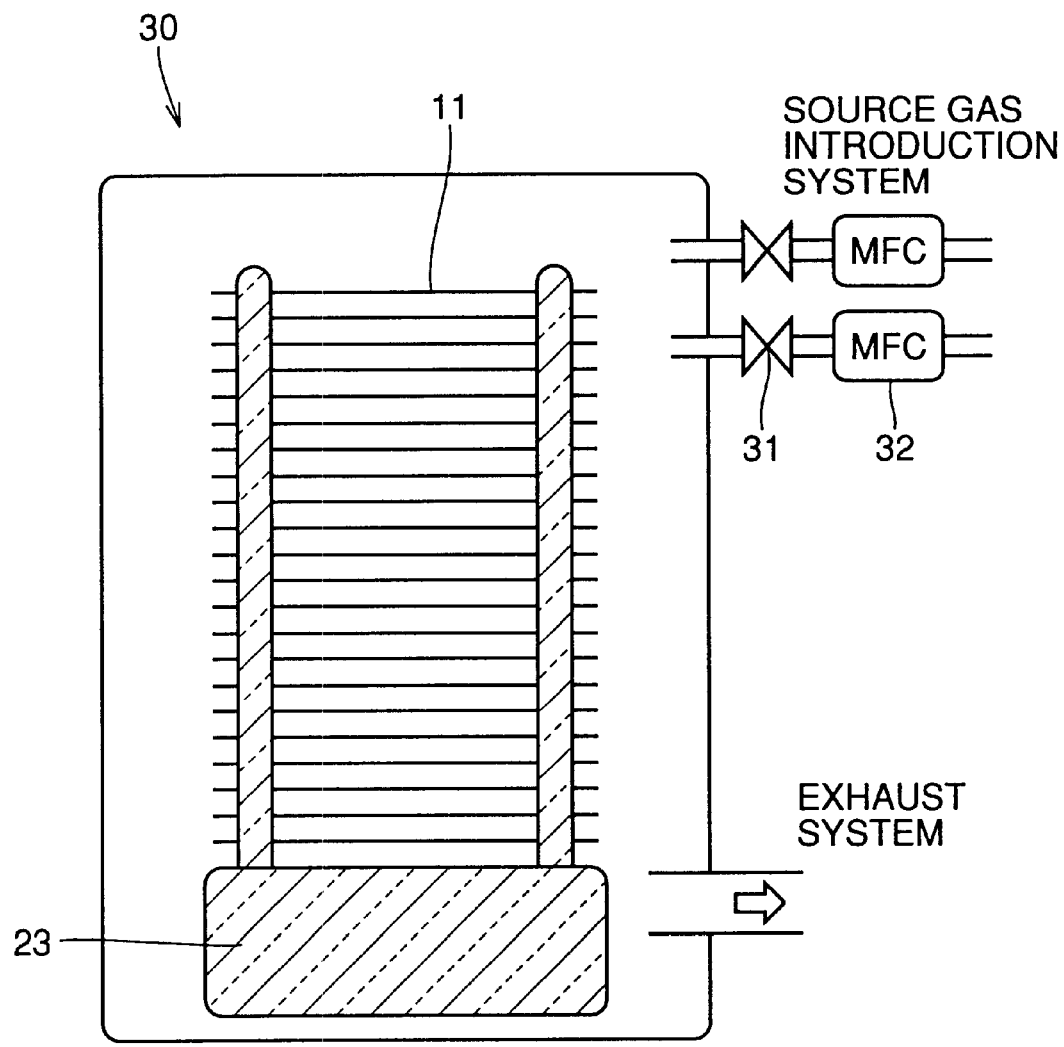
FIG. 4 schematically shows a structure of an LPCVD (Low Pressure Plasma CVD) device in the first embodiment.
Figure 5:
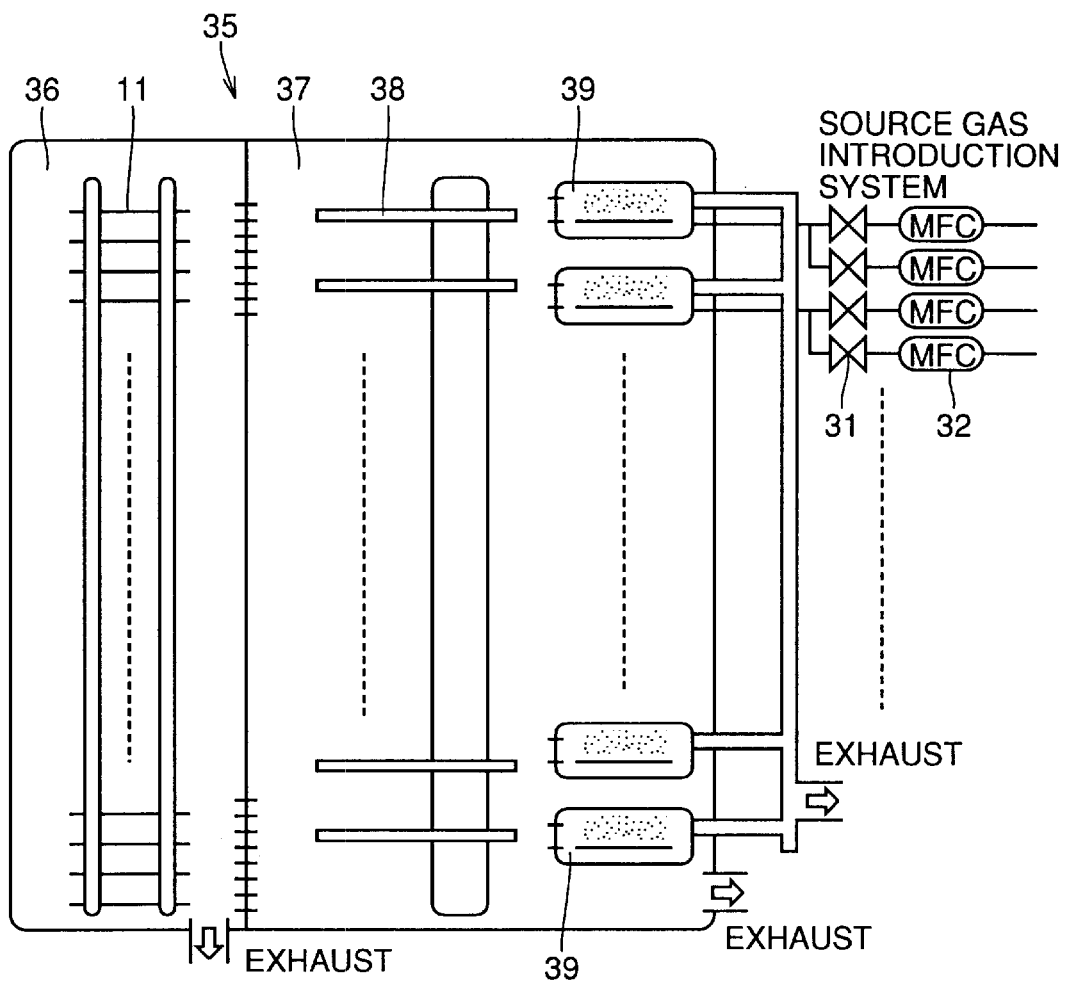
FIG. 5 schematically shows a structure of a CVD (PECVD: Plasma Enhanced Chemical Vapor Deposition) device in the first embodiment.

Exemplary CVD apparatus will now be shown. Any of the CVD apparatuses may be similar to those used in manufacturing typical liquid crystal display devices. As shown in FIG. 4, an LPCVD device 30 includes in a chamber a quartz board 23 supporting a substrate, an exhaust mechanism capable of pressure reduction for example by means of a pump (not shown), and a piping system having a mass flow controller (MFC) 32, a valve 31 and the like to introduce a gas used for film deposition. Furthermore, as shown in FIG. 5, in a plasma CVD (PECVD: Plasma Enhanced Chemical Vapor Deposition) apparatus a film deposition chamber 39 having a plasma creating mechanism has connected thereto a piping including MFC 32, valve 31 and the like to introduce a gas used for film deposition. Furthermore, to previously heat and cool substrate 11 and also pass and receive the substrate to and from the film deposition chamber under a low pressure, there also be provided two chambers, a load lock chamber 36 and an auxiliary chamber 37 provided with a transport robot 38. Furthermore, film deposition chamber 39 has a respective, independent exhaust mechanism using a pump to vacuum the chamber to a lower pressure. In addition to this CVD apparatus, in the same atmosphere there may also be arranged a laser annealing chamber crystallizing amorphous silicon to provide polycrystalline silicon. The laser anneal device used may be a typical device producing polycrystalline silicon at a low temperature of approximately 300° C.

The above apparatuses can achieve the following effect: while a substrate is being processed from a cleaning step through a film deposition step to a laser annealing step it can be free of exposure to the external atmosphere and it can also be processed automatically through the steps sequentially provided. This can reduce chemical contamination of the substrate and particles adhering thereto. Furthermore, introducing into such a loosely sealed structure a gas having a controlled atmosphere can further reduce a contaminant adhering to the substrate. The gas used may be a safe and relatively inexpensive gas, such as gaseous nitrogen, dry air and the like and desirably a chemical filter is used to remove a contaminant from the gas before it is introduced into the apparatus. Since each chamber has a loosely sealed structure, if a large-scale glass substrate is processed for a liquid crystal display device the loosely sealed structure can significantly reduce the cost for manufacturing the device, as compared to a completely sealed structure. Furthermore, the present apparatus is significantly effective when its film deposition device is an LPCVD device, since when low-pressure chemical vapor deposition is employed to deposit amorphous silicon which is in turn crystallized to provide polycrystalline silicon, the LPCVD deposition rate is significantly slow and the underlying layer's contamination has a significant effect on the silicon. Because of the effect of such contamination, the polycrystalline silicon's crystallinity can readily vary. Consequently, the completed TFT has a characteristic significantly affected by such contamination. In contrast, the apparatus of the present embodiment can reduce the variance as described above, to fabricate a TFT having a stable characteristic.

Furthermore, centering the transport robot and arranging each unit therearound allow the apparatus to be significantly compact and thus save more space. Furthermore, the present embodiment can employ both the UV radiation unit and another, wet cleaning unit to ensure that a substrate is free of organic matters and metal contamination. Furthermore, using an oxidizing processing agent can remove organic matters more effectively. However, if the contaminant of interest may be limited to organic matters, the cleaning unit and the UV radiation unit suffice. In this arrangement, the apparatus can simply have a conventional film deposition apparatus with a transport robot and a film deposition chamber together sandwiching a UV radiation unit therebetween. As such, the apparatus can be a significantly compact apparatus to save its space more effectively.

Second Embodiment

Figure 6:
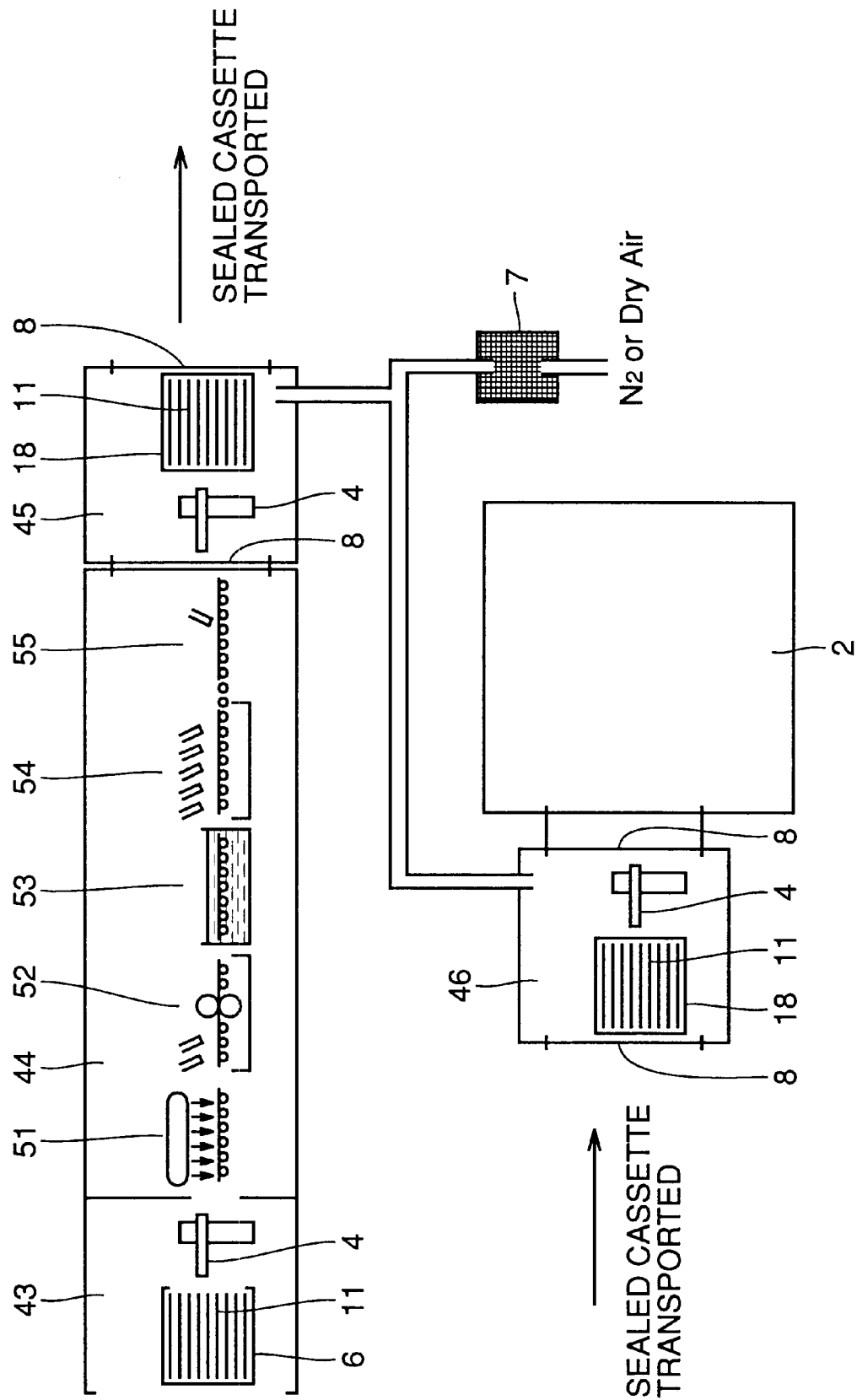
FIG. 6 illustrates a scheme for transporting a substrate from a cleaning chamber to a film deposition chamber in a second embodiment of the present invention.

As shown in FIG. 6, a cleaning device may be a conventional cleaning device used in manufacturing a liquid crystal display device, including a UV radiation unit 51, a physical cleaning unit 52 cleaning a substrate with a brush, megasonically, and the like, a chemical cleaning unit 53 using a chemical to clean a substrate, a water-washing unit 54, and a drier unit 55. Film deposition chamber 2 is provided with a CVD apparatus having a capability equivalent to that described in the first embodiment. The cleaning chamber 44 unloader 43 is provided with a mechanism (not shown) which loads substrate 11 into a cassette 18 having a door sealable, provided with a rubber packing, and then closes the door to seal the substrate in the cassette. Furthermore, the film deposition chamber 1 loader 46 is provided with a mechanism (not shown) which opens the door of the sealed cassette. Sealed cassette 18 may be transported from the cleaning chamber to the film deposition chamber for example by means of an AGV or it may be automatically transported from the cleaning chamber to the film deposition chamber by means of a conveyor.

Furthermore, the cleaning chamber's unloader 45 and the film deposition chamber's loader 46 each has an entrance and an exit each provided with a door 8, which can be opened and closed as required and when it is closed unloader 45 and loader 46 are generally sealed to have a loosely sealed structure. Furthermore, into unloader 45 and loader 46 through chemical filter 7 is introduced gaseous nitrogen, dry air or the like having a flow rate controlled to maintain a pressure more positive than that external to the apparatus and thus prevent the atmosphere external to the apparatus from mixing into that internal to the apparatus.

The atmosphere in the sealed cassette may be dry air corresponding to the atmosphere in unloader 45 of the cleaning chamber. Alternatively, apart from the atmosphere in unloader 45, separate, contaminant-free gaseous nitrogen or dry air may be sent directly into the cassette and thus sealed therein, which allows the cassette to have an internal atmosphere controlled more reliably. Furthermore, vacuuming the cassette to attain no more than $10^3$ Pa after it is sealed can also reduce a contaminant in the atmosphere to approximately $1/100$ and thus sufficiently reduce the contaminant adhering to a substrate.

Figure 7:
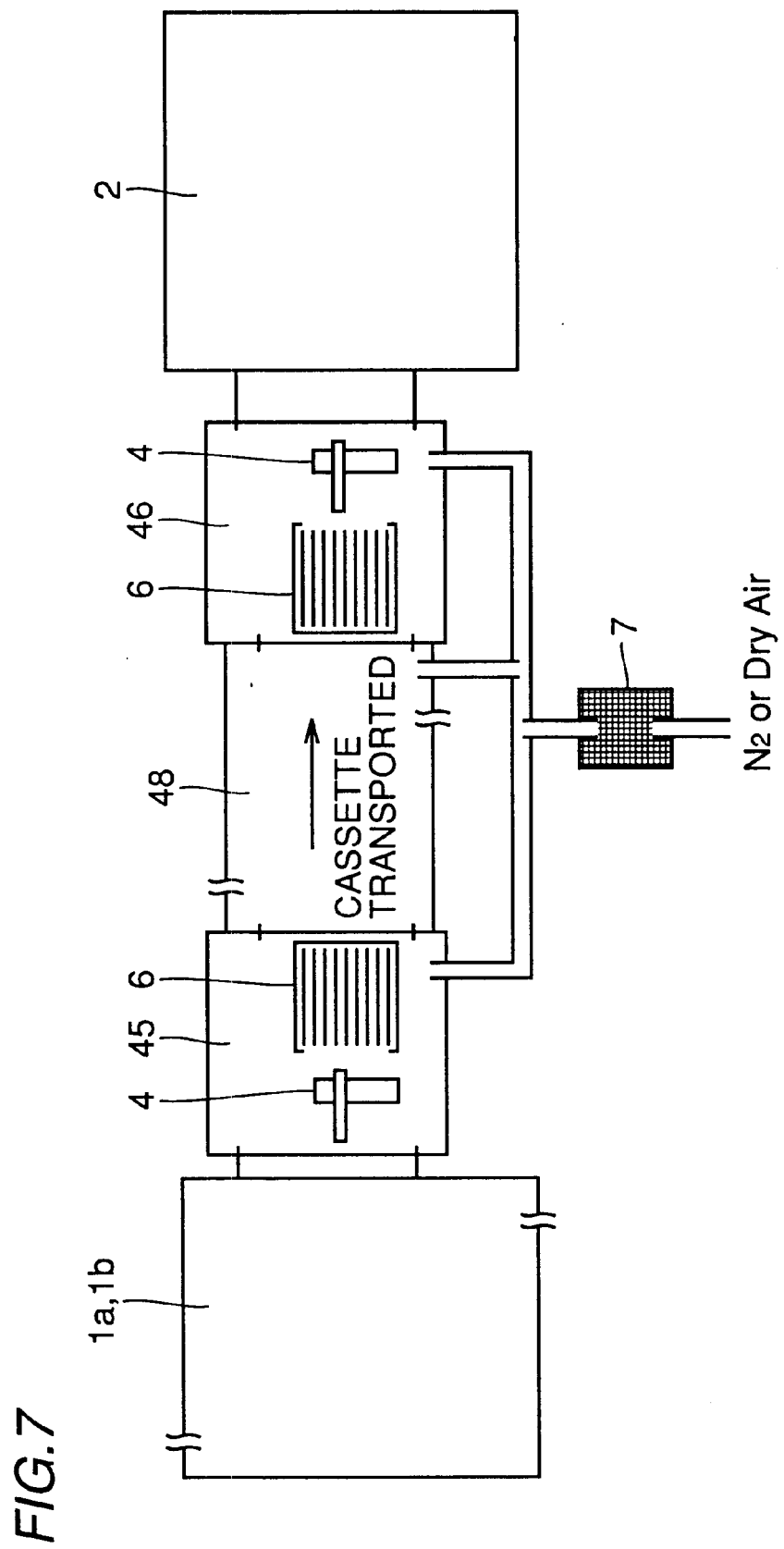
FIG. 7 illustrates another scheme for transporting a substrate from a cleaning chamber to a film deposition chamber in the second embodiment.

As another method, as shown in FIG. 7, between the cleaning chamber's unloader 45 and the film deposition chamber's loader 46 there may be provided a generally or loosely sealed path 48 having an internal atmosphere controlled. This arrangement can dispense with the mechanism sealing cassette 18 and that opening and closing the cassette. As compared to a completely sealed structure, the present structure can also significantly reduce the cost for manufacturing a liquid crystal display device in processing a large-scaled glass substrate used for the device.

While in the first and second embodiments the film deposition apparatus correspond to a CVD apparatus, it is needless to say that the present invention is applicable to a sputtering apparatus, since particles adhering to a cleaned substrate similarly result in a reduced yield.

Third Embodiment

Figure 8:
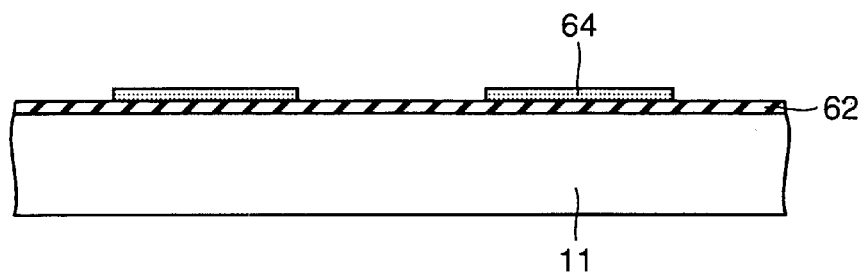
FIG. 8 is a cross section showing forming an underlying layer on a glass substrate and forming an amorphous silicon film thereon and then annealing and thus crystallizing the amorphous silicon film and patterning a transistor portion.
Figure 9:
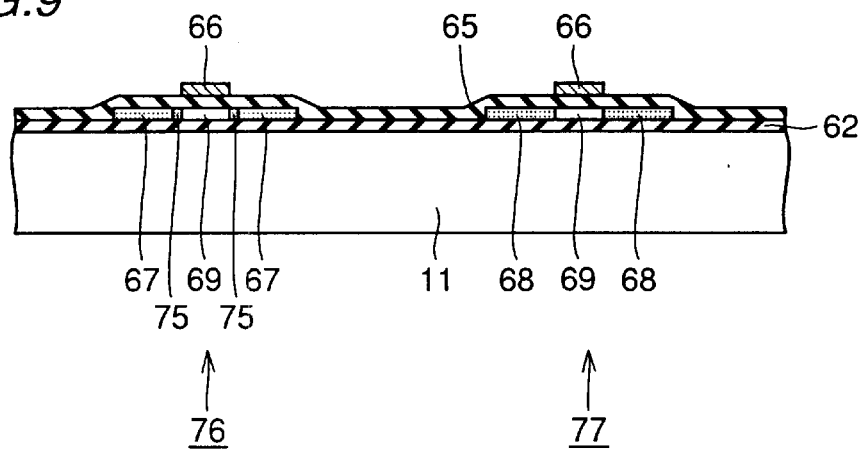
FIG. 9 is a cross section showing depositing) a gate insulating film, introducing dopant ions into source/drain regions, and providing gate wiring.

Hereinafter a method will now be described that uses an apparatus of the present invention, the apparatus described in the first or second embodiment plus a laser annealing chamber, to fabricate a polycrystalline silicon TFT of a driver circuit portion of a liquid crystal display device. Initially, as shown in FIG. 8, PECVD or the like is employed to provide on a surface of glass substrate 11 an underlying film corresponding to a double-layered film 62 formed of silicon nitride film and silicon oxide film successively formed. Then, the aforementioned apparatus providing cleaning, film deposition and annealing units integrated together is used to sequentially provide a cleaning step, a film deposition step provided by an LPCVD apparatus and a laser annealing step. The cleaning step provides UV radiation, brush-cleaning and megasonic-cleaning, and thereafter uses ozone water or HF-type cleaning liquid to chemically clean a substrate. Then, without being exposed to the external atmosphere the substrate is transported to the film deposition chamber and thus subjected to the film deposition step, in which the FIG. 4 LPCVD apparatus is used to form an amorphous silicon film of approximately 60 nm. Furthermore, with the substrate not exposed to the external atmosphere, the laser annealing device attached to the above apparatus anneals the amorphous silicon of a transistor's channel portion to provide polycrystalline silicon. Then, as shown in FIG. 8, the polycrystalline silicon is dry-etched and thus patterned to provide a transistor region 64. Then, as shown in FIG. 9, as a gate insulating film a silicon oxide film 65 of approximately 70 nm is provided for example through tetra ethyl ortho silicate (TEOS) PECVD. Then, a photoresist is provided and in an n transistor 76 at opposite ends of a channel region 69 phosphorus ions are lightly doped to provide an n doped region's lightly doped domain (LDD) 75. Then, a Cr film or the like is deposited and patterned to provide a gate electrode 66. Then, phosphorus ions and boron ions are successively implanted to form an $n^+$-doped region 67 and a p-doped region serving as source/drain regions and in those regions n and p transistors 76 and 77 are fabricated, respectively. The phosphorus ions and the boron ions are implanted to allow the n transistor to have the phosphorus ion implanted and the p transistor to have the boron ions implanted.

Figure 10:
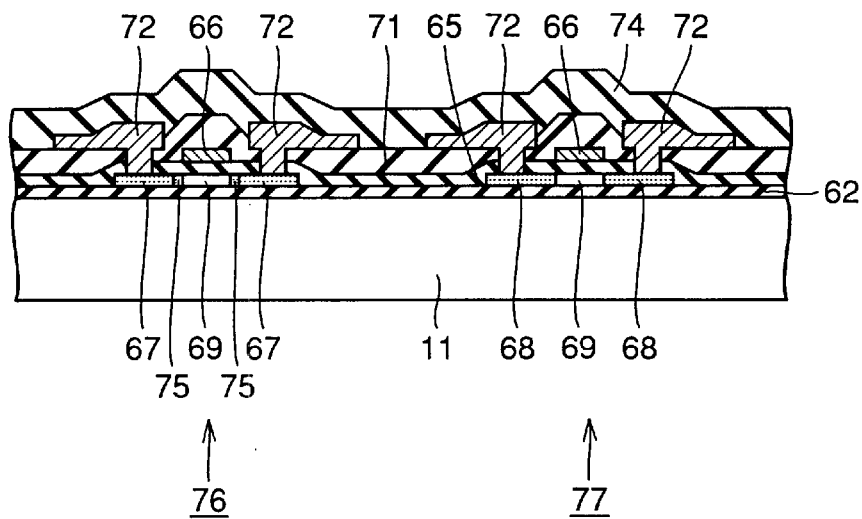
FIG. 10 is a cross section showing providing an interlayer insulating film, source/gate electrodes and a protective insulating film.

Then, as shown in FIG. 10, TEOS PECVD is employed to provide a silicon oxide film 71 as a protection film and then activation anneal is performed at 400° C. The protection film is dry-etched to have a contact hole, and a Cr film of 100 nm, an Al-type alloy film of 400 nm and furthermore a Cr film of 100 nm are successively sputtered and thus stacked and then patterned to provide a source/drain electrode 72. Then, in a hydrogen plasma the channel portion's polycrystalline silicon is hydrogenated to provide an enhanced and stable characteristic and a silicon nitride film or the like is then applied to provide an insulating film 74. N and p transistors 76 and 77 thus fabricated are combined together to configure a CMOS circuit provided in a driver circuit.

Figure 11:
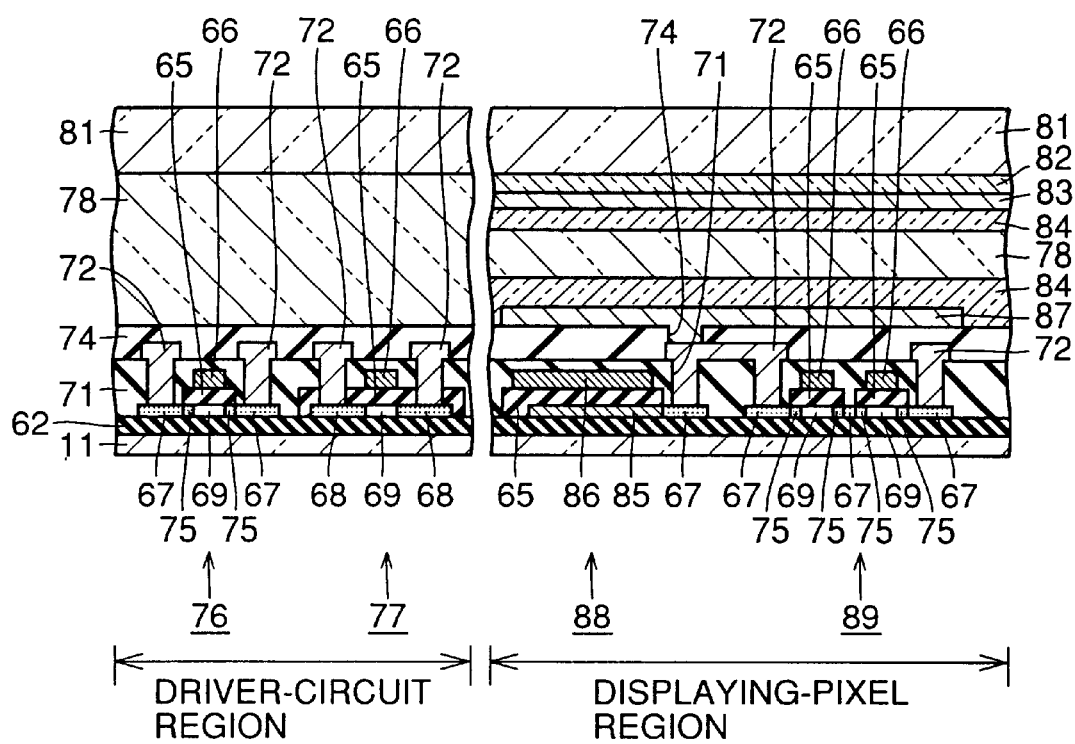
FIG. 11 is a cross section of a liquid crystal display device at a driver circuit region and a displaying pixel region.
Figure 12:
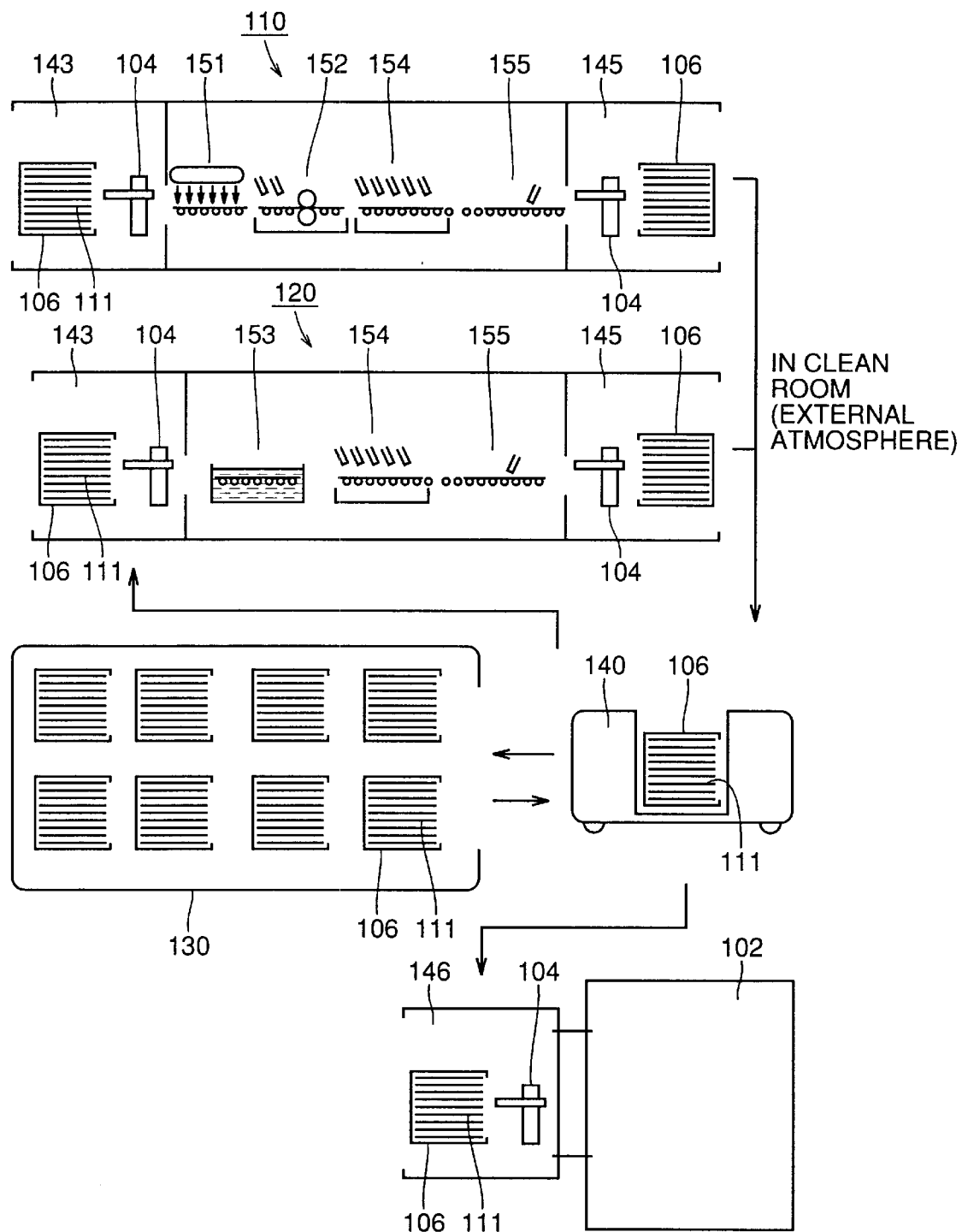
FIG. 12 represents the atmosphere of a conventional transport operation, from a cleaning process to a film deposition process.

Any type of layer common to the driver circuit region and a displaying pixel region fabricated on the same glass substrate as the driver circuit region is fabricated, is deposited when the layer is deposited for the driver circuit region. As shown in FIG. 11, a device portion in the displaying pixel region is identical to that in the driver circuit region, except for a pixel transistor 89 formed of two n transistors used for a pixel, and a capacitance 88 having a top electrode 86 and a bottom electrode 85. The film deposition procedure in the displaying pixel region is provided in parallel with that in the driver circuit region, proceeding integrated therewith. After an insulating film 74 is provided on the side of a lower glass substrate, in the displaying pixel region a pixel electrode 87 is connected via a contact hole to the displaying pixel region at the n transistor and thereon is formed an orientation film 84. In the displaying pixel region on an upper glass substrate 81 a color filter 82 and an opposite electrode 83 are stacked and thereon orientation film 84 is formed. Then, the upper and lower glass substrates thus processed are stacked together with a gap therebetween and into the gap liquid crystal 78 is introduced to complete a liquid crystal display device (FIG. 11).

In the liquid crystal display device fabricated as above, the channel portion's polycrystalline silicon can be free of such contamination as attributed to organic matters, metals and the like that comes from layers overlying and underlying the polycrystalline silicon. As such, the polycrystalline silicon after it is laser annealed does not suffer a metal impurity otherwise mixing thereinto and thus varying the transistor's threshold voltage Vth, nor does the underlying layer have an impurity affecting and thus varying the crystal growth in the crystallization step and thus degrading the TFT's characteristics. The present apparatus can also reduce particles from again adhering to a substrate before each film is deposited. As a result, the TFT can have a threshold voltage free of any disadvantageous variation nor does the capacitance insulation film have a low breakdown voltage, and the product can be improved in yield, durability, reliability and any other aspects. In the present embodiment, the apparatus of the first embodiment plus a laser annealing device is introduced in the step of depositing silicon for the channel portion and the step of laser-annealing the same, which is significantly effective in providing an enhanced characteristic. However, since it can effectively reduce particles again adhering a substrate after it is cleaned, it can be applied to another sputtered and deposited film or the like to provide an increased yield of the sputtered and thus deposited film.

Fourth Embodiment

In fabricating the liquid crystal display device of the third embodiment, the apparatus of the second embodiment can be used to clean a substrate for example in a chemical bath to clean the substrate with a strongly acidic chemical, a significantly heated chemical and the like that are controlled in temperature. For example, the present embodiment can use an RCA cleaning liquid often used in fabricating a semiconductor device, i.e., a cleaning liquid formed of $H_2SO_4+H_2O_2+H_2O$, cleaning liquids such as $NH_3+H_2O_2+H_2O$, $HCl+H_2O_2+H_2O$, $HF+H_2O$, and the like. Such cleaning liquids are combined as appropriate depending on the matter(s) to be removed, the damage(s) to the glass substrate's surface, and the like, and each step is provided at an appropriate temperature of a room temperature to approximately 100° C. These cleaning steps can remove a contaminant and thus prevent the contaminant from adhering to the substrate during the film deposition and annealing steps. In the liquid crystal display device fabricated as above, there can be provided a channel portion with overlying and underlying layers free of such contamination as attributed to organic matters, metals and the like, nor does the polycrystalline silicon after it is laser annealed have a metal impurity that would otherwise vary Vth and affect the silicon's crystallinity in the crystallization step. As such, the TFT's characteristics are not degraded. Furthermore, the present embodiment can also reduce particles again adhering to the substrate before each film is deposited. Thus, the TFT threshold voltage Vth does not have a disadvantageous variance nor does the capacitance insulation film have a low breakdown voltage. Thus the product can be improved in yield, durability, reliability and any other aspects.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An apparatus for manufacturing a liquid crystal display device, comprising:
    a cleaning chamber for cleaning a substrate of a liquid crystal display device and including a wet cleaning unit for wet cleaning the substrate and a UV radiation unit for irradiating the substrate with ultraviolet light;
    a film deposition chamber for depositing a film on the substrate cleaned in said cleaning chamber; and
    means for transporting the substrate from said cleaning chamber to said film deposition chamber along a path blocking entry of air external to the path, thereby preventing the substrate from being exposed to the external atmosphere, wherein
        the path is a loosely sealed structure and contains an inert gas surrounding the substrate and maintained at a pressure greater than the external atmosphere, and
        the means for transporting includes a transporter transporting the substrate along the path.

2. The apparatus according to claim 1, wherein said means for transporting includes means for inputting into a cassette isolatable from the external atmosphere the substrate cleaned in said cleaning chamber, while preventing the substrate from being exposed to the external atmosphere, and means for outputting in said film deposition chamber the substrate from said cassette.

3. The apparatus according to claim 2, wherein said cassette has a loosely sealed structure, and said cassette contains an inert gas surrounding the substrate and maintained at a pressure greater than the external atmosphere.

4. The apparatus according to claim 3, further comprising a chemical filter for introducing the inert gas into the cassette.

5. The apparatus according to claim 1, further comprising a cassette loading chamber and a transport robot chamber including a transport robot, said cassette loading chamber, said cleaning chamber, and said film deposition chamber being arranged surrounding said transport robot and connected to said transport robot chamber to allow said transport robot to input and output the substrate.

6. The apparatus according to claim 1, further comprising an annealing chamber connecting to the path and blocked from the external atmosphere, for annealing the substrate.

7. The apparatus according to claim 6, wherein said annealing chamber includes an optical alignment unit for laser-annealing the substrate.

8. The apparatus according to claim 1, wherein said film deposition chamber includes a first film deposition chamber connecting to the path and a second film deposition chamber connecting to the path.

9. The apparatus according to claim 1, further comprising a chemical filter for introducing the inert gas to the path.

10. The apparatus according to claim 1, wherein said cleaning chamber and said film deposition chamber are loosely sealed and contain the inert gas surrounding the substrate and maintained at a pressure greater than the external atmosphere.

11. The apparatus according to claim 1, wherein the path has a gas inlet for introducing the inert gas to the path.

12. An apparatus for manufacturing a liquid crystal display device comprising:

a cleaning chamber for wet cleaning a substrate of a liquid crystal display device and including at least one of a spinning washing unit, a brush-washing unit, a megasonically-washing unit, and a chemically-washing unit and including a UV radiation unit for irradiating the substrate with ultraviolet light;

a film deposition chamber for depositing a film on the substrate cleaned in said cleaning chamber; and means for transporting the substrate from said cleaning chamber to said film deposition chamber along a path blocking entry of air external to the path, wherein the path is a loosely sealed structure and contains an inert gas surrounding the substrate and maintained at a pressure greater than the external atmosphere.

13. The apparatus according to claim 12, wherein said cleaning chamber has a loosely sealed structure and contains an inert gas surrounding the substrate and maintained at a pressure greater than the external atmosphere.

14. An apparatus for manufacturing a liquid crystal display device comprising:

a cleaning chamber for wet cleaning a substrate of a liquid crystal display device including a washing unit with a substrate rotating unit and an arm having a nozzle for liquid chemicals, wherein said washing unit includes at least one of a cup for preventing liquid from scattering and a substrate-supporting table, said cup and said table being stainless steel coated with polytetrafluoroethylene, and including a UV radiation unit for irradiating the substrate with ultraviolet light;

a film deposition chamber for depositing a film on the substrate cleaned in said cleaning chamber; and means for transporting the substrate from said cleaning chamber to said film deposition chamber along a path.

* * * * *

UNITED STATES PATENT AND TRADEMARK OFFICE
CERTIFICATE OF CORRECTION

PATENT NO.      : 6,461,437 B1                                            Page 1 of 1
DATED           : October 8, 2002
INVENTOR(S)     : Kubota et al.

It is certified that error appears in the above-identified patent and that said Letters Patent is hereby corrected as shown below:

<u>Title page, Item [54], and Column 1, Lines 1-3,</u>
Change "APPARATUS USED FOR FABRICATING LIQUID CRYSTAL DEVICE AND METHOD OF FABRICATING THE SAME" to -- APPARATUS USED FOR FABRICATING LIQUID CRYSTAL DEVICE --.

Signed and Sealed this

Twenty-second Day of July, 2003

JAMES E. ROGAN
*Director of the United States Patent and Trademark Office*